(12) United States Patent
Gu et al.

(10) Patent No.: US 9,184,288 B2
(45) Date of Patent: Nov. 10, 2015

(54) SEMICONDUCTOR STRUCTURES WITH BRIDGING FILMS AND METHODS OF FABRICATION

(71) Applicant: GLOBALFOUNDRIES Inc., Grand Cayman (KY)

(72) Inventors: Sipeng Gu, Clifton Park, NY (US); Zhiguo Sun, Halfmoon, NY (US); Sandeep Gaan, Clifton Park, NY (US); Danni Chen, Clifton Park, NY (US); Wen-Pin Peng, Clifton Park, NY (US); Huang Liu, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 70 days.

(21) Appl. No.: 14/207,822

(22) Filed: Mar. 13, 2014

(65) Prior Publication Data
US 2015/0263169 A1 Sep. 17, 2015

(51) Int. Cl.
| H01L 21/8238 | (2006.01) |
| H01L 29/78 | (2006.01) |
| H01L 29/40 | (2006.01) |
| H01L 21/02 | (2006.01) |

(52) U.S. Cl.
CPC ...... *H01L 29/7843* (2013.01); *H01L 21/02164* (2013.01); *H01L 21/02205* (2013.01); *H01L 21/02211* (2013.01); *H01L 21/02271* (2013.01); *H01L 29/401* (2013.01)

(58) Field of Classification Search
CPC ............... H01L 29/7843; H01L 21/76829
See application file for complete search history.

(56) References Cited

U.S. PATENT DOCUMENTS

2009/0020791 A1 * 1/2009 Yu et al. .................. 257/288

\* cited by examiner

*Primary Examiner* — Thomas L Dickey
(74) *Attorney, Agent, or Firm* — Heslin Rothenberg Farley & Mesiti P.C.; Nicholas Mesiti, Esq.

(57) ABSTRACT

Semiconductor structures and fabrication methods are provided having a bridging film which facilitates adherence of both an underlying layer of dielectric material and an overlying stress-inducing layer. The method includes, for instance, providing a layer of dielectric material, with at least one gate structure disposed therein, over a semiconductor substrate; providing a bridging film over the layer of dielectric material with the at least one gate structure; and providing a stress-inducing layer over the bridging film. The bridging film is selected to facilitate adherence of both the underlying layer of dielectric material and the overlying stress-inducing layer by, in part, forming a chemical bond with the layer of dielectric material, without forming a chemical bond with the stress-inducing layer.

20 Claims, 6 Drawing Sheets

SEMICONDUCTOR STRUCTURES WITH BRIDGING FILMS AND METHODS OF FABRICATION

BACKGROUND

Semiconductor structures, such as semiconductor devices or integrated circuits, typically include transistors and involve several processing steps of patterning and etching to form the desired circuit structures. During each processing step, materials may, for instance be deposited on, or etched from a semiconductor wafer being processed. Because each step of a fabrication process may introduce complexity and cost, it is desirable to reduce or minimize defects within or between materials used in order to maximize fabrication efficiency and enhance commercial advantage.

BRIEF SUMMARY

The shortcomings of the prior art are overcome and additional advantages are provided through the provision, in one aspect, of a method which includes fabricating a semiconductor structure. The fabricating includes: providing a layer of dielectric material, with at least one gate structure disposed therein, over a semiconductor substrate; providing a bridging film over the layer of dielectric material with the at least one gate structure disposed therein; and providing a stress-inducing layer over the bridging film, where the bridging film is selected to facilitate adherence to both the layer of underlying dielectric material and the overlying stress-inducing layer by, in part, forming a chemical bond with the layer of dielectric material, without forming a chemical bond with the stress-inducing layer.

In a further aspect, a semiconductor structure is provided which includes: a layer of dielectric material, with at least one gate structure disposed therein, over a semiconductor substrate; a bridging film over the layer of dielectric material with the at least one gate structure, the bridging film being chemically bonded to the layer of dielectric material; and a stress-inducing layer over the bridging film, and adhered thereto, absent chemical bonding thereof to the bridging film.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Further, note that, in making reference below to the drawings (which are not drawn to scale for ease of understanding) the same reference numbers used through-out different figures designate the same or similar components.

Disclosed herein, in part, are methods of fabricating semiconductor structures using bridging films to facilitate adherence between specific types of layers such as between a layer of dielectric material and a stress-inducing layer. During fabrication of certain semiconductor devices, multiple layers may be (for instance) provided on a semiconductor wafer. These layers may include or be fabricated of materials which may be incompatible. Such an incompatibility of materials could cause, for instance, the one or more of the layers to be susceptible to delamination and/or peeling at the interface between certain layers, for instance, during one or more fabrication processing steps, which could result in degradation of the resultant semiconductor device(s).

Figure 1A:
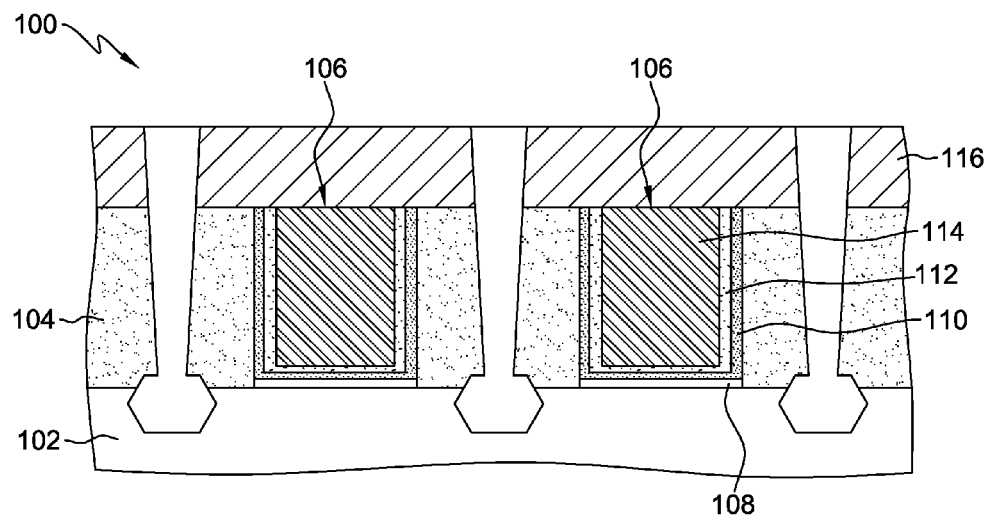
FIG. 1A depicts one embodiment of a semiconductor structure to be modified, in accordance with one or more aspects of the present invention.
Figure 1B:
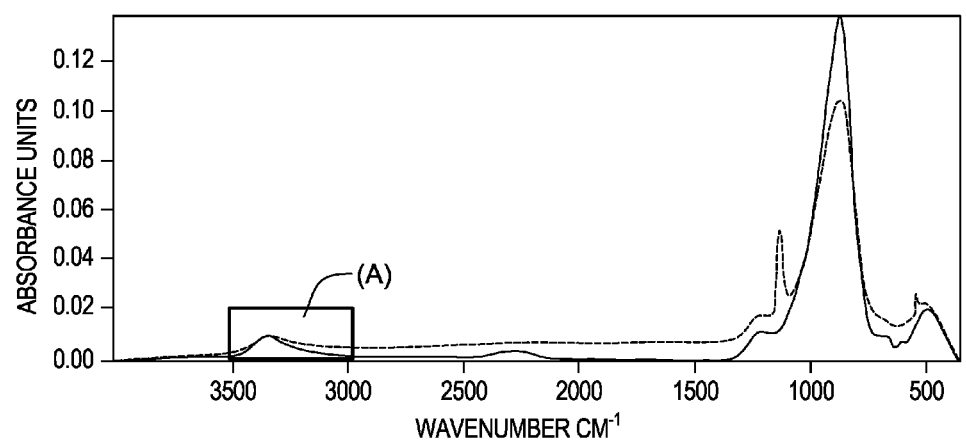
FIG. 1B graphically depicts inclusion of hydrogen-bonding groups within a layer of dielectric material of the structure of FIG. 1A.

By way of example, FIG. 1A depicts one embodiment of a semiconductor structure 100. In this example, semiconductor structure 100 includes a substrate 102, such as a semiconductor substrate. In one example, substrate 102 may be a bulk semiconductor material such as a bulk silicon wafer. As another example, substrate 102 may be or include any silicon-containing substrate including, but not limited to, silicon (Si), single crystal Si, crystalline Si, amorphous Si, Si-on-nothing (SON), Si-on-insulator (SOI), or Si-on-replacement insulator (SRI) or the like. A layer of dielectric material 104 is shown disposed over substrate 102. In one embodiment, dielectric material layer 104 may be or include an uncured dielectric material having hydrogen-bonding groups disposed within the uncured dielectric material. In one example, the dielectric material may be a flowable oxide, of relatively low quality within the spectrum of available oxides, and may be deposited using any conventional deposition process(es), such as, a chemical vapor deposition (CVD) process. As a specific example, the flowable oxide, (for instance, represented by a chemical formula of $(R—Si(OH)_xO_{(3-x)/2})_n$, where R is hydrogen or a methyl group, n≥8 and x=0-2) may include hydrogen-bonding groups such as, for instance, silanol (Si—OH) groups, disposed within the flowable oxide material. Note that, Fourier Transform Infrared (FT-IR) spectrum analysis of flowable oxide material reveals the silanol group which may be characterized by its broad silanol (Si—OH) peak (A) at about 3400 cm$^{-1}$, as shown in FIG. 1B. The silanol (Si—OH) group disposed within such a dielectric material layer forms a chemical bond, for instance, intra-molecular hydrogen bonding with an adjacent silanol (Si—OH) group, resulting in a chemical lattice structure within the flowable oxide material. Alternatively, the terminally situated silanol (Si—OH) groups of the flowable oxide material, may also form an inter-molecular hydrogen bonding with subsequently deposited layers. In another example, dielectric material layer 104 may include, but not be limited to, silicon oxide (SiO$_2$), fluorinated silicate glass (FSG).

One or more gate structures 106 may be provided within dielectric material layer 104 at selected locations to operate as, for instance, the gates of transistors being fabricated within semiconductor structure 100. Gate structure 106 may include one or more gate layers disposed within one or more openings patterned within dielectric material layer 104. The one or more gate layers may include, for instance, an interfacial layer 108, a gate dielectric layer 110 disposed over interfacial layer 108, and one or more work function layers 112 disposed over gate dielectric layer 110. Note that one or more of these layers may be formed using a variety of different materials and techniques, such as, for instance, atomic layer deposition (ALD), chemical vapor deposition (CVD) or physical vapor deposition (PVD) processes. The thickness of the layers may also vary, depending upon the particular application.

Gate fabrication further includes providing a gate material 114 over the one or more gate layers 108, 110, 112, which in one embodiment, may be a sacrificial gate material, such as amorphous silicon (a-Si) or polycrystalline silicon (polysilicon), intended to be subsequently replaced with a replacement gate material as part of gate-last fabrication process. Alternatively, gate material 114 could be or include a metal gate as part of a gate-first fabrication process.

Figure 1C:
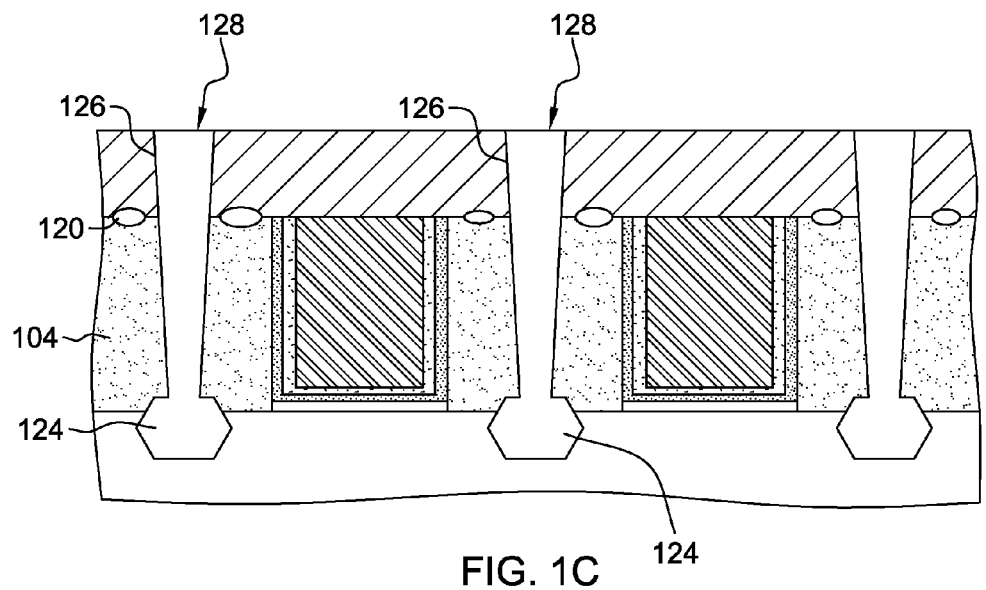
FIG. 1C depicts the structure of FIG. 1A with a partial delamination shown at the junction of a stress-inducing layer and layer of dielectric material within the structure.

Continuing with FIG. 1A, a stress-inducing layer 116 is provided over dielectric material layer 104 and gate structure(s) 106. In one example, stress-inducing layer 116 may be or include a compressive stress-inducing material relative to one or more of the underlying layers or substrate, and may be provided using conventional deposition processing such as chemical vapor deposition (CVD) processing. In a specific example, stress-inducing layer 116 may be or include a nitride material, such as silicon nitride (Si$_3$N$_4$ or SiN), or silicon oxynitride (SiON). As discussed above, note that hydrogen-bonding groups, for instance, terminal silanol (Si—OH) groups within dielectric material layer 104 may form an inter-molecular hydrogen-bonding with electronegative species or "electron-loving" species of adjacent material, such as, the nitride material of a stress-inducing layer 116. This inter-molecular hydrogen-bonding disadvantageously creates a weak bonding energy at the junction or interface of the dielectric material layer and the stress-inducing layer, which in turn can result in delamination and/or peeling of the stress-inducing layer 116, as shown in FIG. 1C. Additionally, in one example, stress-inducing layer 116 may have an intrinsic compressive stress of (for instance) about 3.3 GPa, which results in a coefficient of thermal expansion mismatch and/or mechanical stress mismatch with at least a portion of the underlying dielectric material layer 104. This induced stress mismatch may also cause the junction or interface of the dielectric material layer and the stress-inducing layer to be susceptible to delamination and/or cracking, resulting in one or more voids 120 at the junction, as shown in FIG. 1C.

Subsequent fabrication processing may include forming source and drain regions (also referred to as active regions 124) disposed within substrate 102, as shown further in FIG. 1C. The active regions 124 may be formed using any suitable techniques including, for example, ion implantation, epitaxial growth of embedded source/drain materials and activation anneals, etc. Dielectric material layer 104 may be patterned to facilitate creating contact openings 126 within which, in one embodiment, a silicide may be formed from a refractory metal, such as, for example, cobalt, nickel, titanium, tantalum, platinum, palladium, rhodium or mixtures thereof that have been chemically reacted with silicon of active regions 124 exposed within contact openings 126. A conductive contact material may subsequently be provided within contact openings 126, to define conductive contact structures 128. In one example, the conductive contact material may be any of a variety of conductive materials, such as, tungsten, copper, aluminum, etc.

Figure 1D:
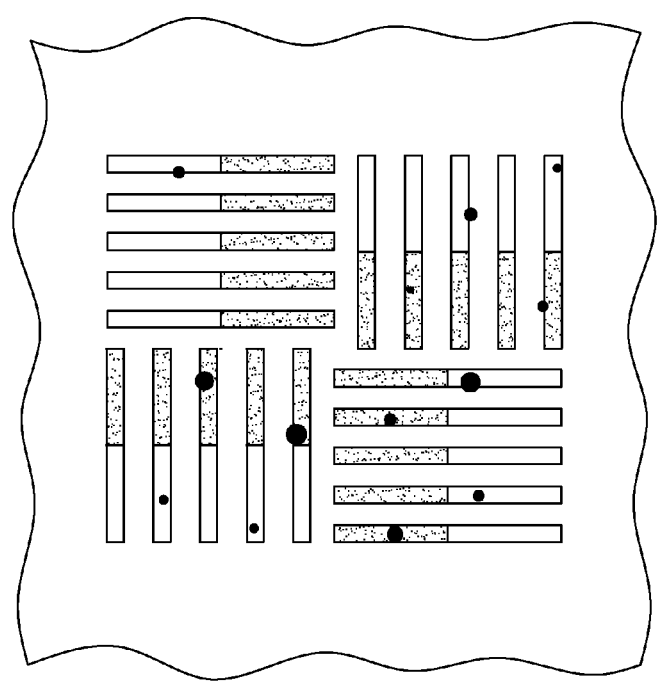
FIG. 1D depicts a partial plan-view of one embodiment of the structure of FIG. 1C and illustrates the partial delamination regions as defects on or within an exposed surface of the structure having an overlay or alignment mask or pattern thereon.

As depicted in FIG. 1D, the one or more voids 120 (see FIG. 1C) created at the interface of the dielectric material layer and the stress-inducing layer may propagate through one or more upper layers (not shown) disposed over a substrate wafer. This propagation of defects could, in turn, result in one or more "overlay" mask alignment errors. In a specific example, this propagation of defects could result in defects in metrology patterns, for instance, advanced-imaging-metrology (AIM) patterns, in turn, resulting in lithography "mask" distortions.

To address these issues, disclosed herein, in one aspect, is a method of fabricating a semiconductor structure using a bridging film to facilitate adherence between specific types of layers such as, between a layer of dielectric material and an overlying stress-inducing layer. The fabricating method includes, for instance: providing a layer of dielectric material, with at least one gate structure disposed therein, over a semiconductor substrate; providing a bridging film over the layer of dielectric material with the at least one gate structure disposed therein; and providing a stress-inducing layer over the bridging film, where the bridging film is selected to facilitate adherence to both the underlying layer of dielectric material and the overlying stress-inducing layer by, in part, forming a chemical bond with the layer of dielectric material, without forming a chemical bond with the stress-inducing layer.

In one embodiment, the layer of dielectric material is or includes an uncured dielectric material which includes hydrogen-bonding groups, for instance, silanol (Si—OH) groups, and providing the bridging film includes selecting the bridging film to facilitate hydrogen bonding of the bridging film to the uncured dielectric material. In one implementation, the bridging film lacks hydrogen-bonding groups, including at an upper surface of the bridging film, which facilitates the bridging film being chemically inert to the overlying stress-inducing layer. Providing the stress-inducing layer may include selecting the stress-inducing layer to facilitate adherence to the bridging film, without chemical bonding, such as hydrogen bonding, between the stress-inducing layer and the bridging film. In one example, the stress-inducing layer is a compressive stress-inducing layer, which may include or be fabricated of a nitride material, such as silicon nitride (SiN), and the bridging film may be or includes a silicon-rich oxide material, such as plasma-enhanced silicon oxide.

In one specific embodiment, the layer of dielectric material may be an uncured dielectric material which includes a first oxide material, and the bridging film may include a second oxide material, with the second oxide material being denser than the first oxide material. For instance, the uncured dielectric material may be a flowable oxide material, and the bridging film may be a silicon-rich oxide material, such as plasma-enhanced silicon oxide.

In one implementation, providing the bridging film and providing the stress-inducing layer may occur within a common plasma chamber. For example, the bridging film may be provided by employing a gaseous mixture within the common plasma chamber, which includes a silane precursor, for example, a silane gas ($SiH_4$) and at least one gaseous material such as, (for example) a nitrous oxide gas ($N_2O$). The stress-inducing layer may be provided by employing a gaseous mixture within the common plasma chamber, which includes a silane precursor, for example, a silane gas ($SiH_4$) and at least one other gaseous material such as, (for example) ammonia gas ($NH_3$).

By way of example, FIGS. 2A-2E depict one detailed embodiment of a method of fabricating a semiconductor structure using a bridging film which adheres well to both an underlying layer of dielectric material and an overlying stress-inducing layer, in accordance with one or more aspects of the present invention.

Figure 2A:
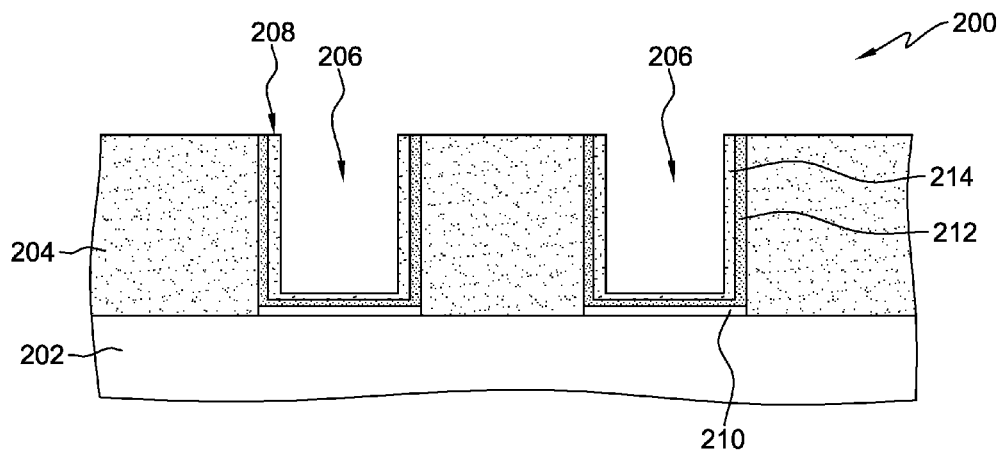
FIG. 2A is a partial cross-sectional elevational view of one embodiment of a semiconductor structure obtained during semiconductor structure fabrication, in accordance with one or more aspects of the present invention.

FIG. 2A illustrates one embodiment of a semiconductor structure 200 useful in a semiconductor structure fabrication process, in accordance with one or more aspects of the present invention. In the example shown, semiconductor structure 200 includes a substrate 202, such as a semiconductor substrate. In one example, substrate 202 may be a bulk semiconductor material such as a bulk silicon wafer. As another example, substrate 202 may include or be a silicon-containing substrate including, but not limited to, silicon (Si), single crystal Si, polycrystalline Si, amorphous Si, silicon-on-nothing (SON), silicon-on-insulator (SOI), or silicon-on-replacement insulator (SRI) substrate or the like. Substrate 202 may in addition or instead include various isolations, dopings and/or device features. For instance, substrate 202 may include other suitable elementary semiconductors, such as, for example, germanium (Ge) in crystal, or a compound semiconductor such as silicon carbide (SiC), gallium arsenide (GaAs), gallium phosphide (GaP), indium phosphide (InP), indium arsenide (InAs), and/or indium antimonide (InSb).

A layer of dielectric material 204 is shown over substrate 202. At this point in the processing flow, dielectric material layer 204 may be or include an uncured dielectric material having, for instance, hydrogen-bonding groups disposed therein. For example, the dielectric material may be a flowable oxide, for instance, of relatively low quality within the spectrum of available oxides, and may be deposited using any conventional deposition process, such as, chemical vapor deposition (CVD) process. As a specific example, the dielectric material could be a flowable oxide represented by a chemical formula of $(R-Si(OH)_xO_{(3-x)/2})_n$, where R is hydrogen or a methyl group, $n \geq 8$ and $x=0-2$). The flowable oxide may include hydrogen-bonding groups such as, for instance, silanol (Si—OH) groups, disposed therein. Note that, as discussed above, Fourier Transform Infrared (FT-IR) spectrum analysis (see FIG. 1B) of flowable oxide material shows the silanol group which may be characterized by its broad silanol (Si—OH) peak (A) at about 3400 $cm^{-1}$. The silanol (Si—OH) groups disposed within the dielectric material layer form a chemical bond, for instance, via intra-molecular hydrogen bonding, with an adjacent silanol (Si—OH) group, resulting in a chemical lattice structure within the flowable oxide material. Additionally, the terminally situated silanol (Si—OH) groups within the flowable oxide material may form an inter-molecular hydrogen bonding with a subsequently deposited layer, such as with a bridging film to be subsequently provided over the layer of dielectric material, in accordance with one or more aspects of the present invention. In another example, dielectric material layer 204 may include, but not be limited to, silicon oxide ($SiO_2$), or fluorinated silicate glass (FSG).

Dielectric material layer 204 may be patterned with one or more openings 206, to facilitate defining one or more gate structures. Openings 206 may be formed to extend to substrate 202 employing any suitable, for instance, etching process, such as an anisotropic dry etching process (for example, an SiConi etch process) to selectively remove portions of dielectric material layer 204 and thereby define openings 206. As a specific example, a dry etching process may be employed to remove dielectric material layer 204 using one or more gas mixtures such as, for example, ammonia ($NH_3$) and nitrogen fluoride ($NF_3$) in a plasma processing chamber.

Gate fabrication may include, for instance, depositing one or more conformal gate layers 208 within openings 206, for instance, using conventional deposition processes. The one or more conformal gate layers 208 may include, for instance, an interfacial layer 210, a gate dielectric layer 212 disposed over interfacial layer 210, and one or more work function layers 214 disposed over gate dielectric layer 212. These gate layers of semiconductor structure 200, may be formed using a variety of different materials and fabrication techniques such as, chemical vapor deposition (CVD), physical vapor deposition (PVD) or plasma-enhanced versions of such processes. The thickness of the depicted layers may also vary, and be tailored or configured for a particular application.

By way of example, interfacial layer 210 may include or be fabricated of, for instance, a layer of silicon oxide disposed within the base of openings 206, which will protect the underlying substrate 202 during subsequent processing. One skilled in the art will note that, interfacial layer 210 may be readily formed within openings 206 via oxidation of, for instance, substrate silicon material during the fabrication process. The silicon substrate material may first be purified by subjecting semiconductor structure 200 to any of various preclean processes using, for instance, dilute hydrochloric acid (DHF) solution, which may also result in an instantaneous oxidation of the silicon substrate material.

In one example, gate dielectric layer 212 may include an oxide material, such as a high-k dielectric material with a dielectric constant k greater than about, for instance, 3.9 (note that k=3.9 for $SiO_2$), and may be deposited via a suitable deposition process, such as atomic layer deposition (ALD), physical vapor deposition (PVD), chemical vapor deposition (CVD), or the like. Example of high-k dielectric materials which may be used as the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide and lead zinc niobate. As noted, one or more work-function layers 214 may be conformally deposited over gate dielectric layer 212, for example, via a deposition process such as ALD, CVD or PVD. The work-function layer(s) 214 may include or be fabricated of, for instance, titanium nitride (TiN), tantalum nitride (TaN), titanium aluminum nitride (TiAlN), tantalum aluminum nitride (TaAlN), niobium nitride (NbN), vanadium nitride (VN), tungsten nitride (WN) or the like.

Figure 2B:
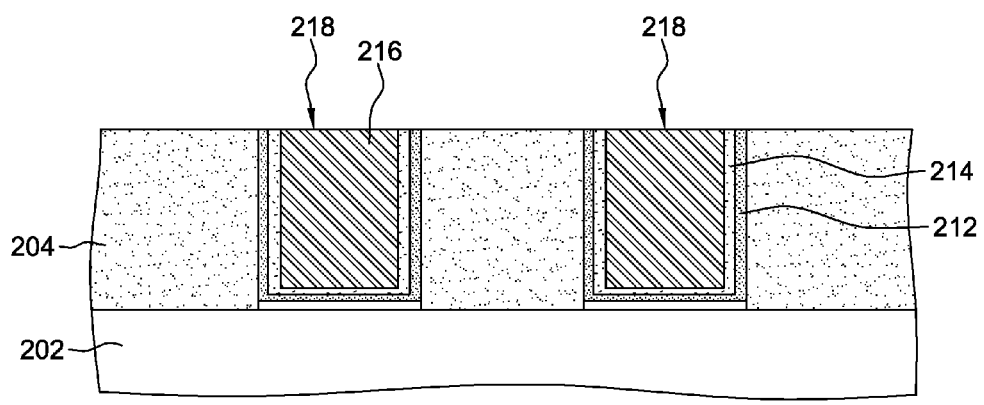
FIG. 2B depicts the semiconductor structure of FIG. 2A after a gate structure has been formed in a layer of dielectric material, in accordance with one or more aspects of the present invention.

As depicted in FIG. 2B, a gate material 216 is provided over work-function layer (s) 214 and planarized to create gate structure(s) 218. Note that, in one embodiment, this gate material 216 may include or be a metal gate, as a part of a gate-first fabrication process. Alternatively, gate material 216 may include or be a sacrificial gate material, such as amorphous silicon (a-Si) or polycrystalline silicon (polysilicon), which will subsequently be replaced with a replacement gate material, as part of a gate-last fabrication process. A non-selective chemical-mechanical polish may be employed to polish away excess gate material 216, with the chemical-mechanical polishing terminating at dielectric material layer 204, resulting in the upper surface of gate material 216 being substantially coplanar with the upper surface of the dielectric material layer 204.

Figure 2C:
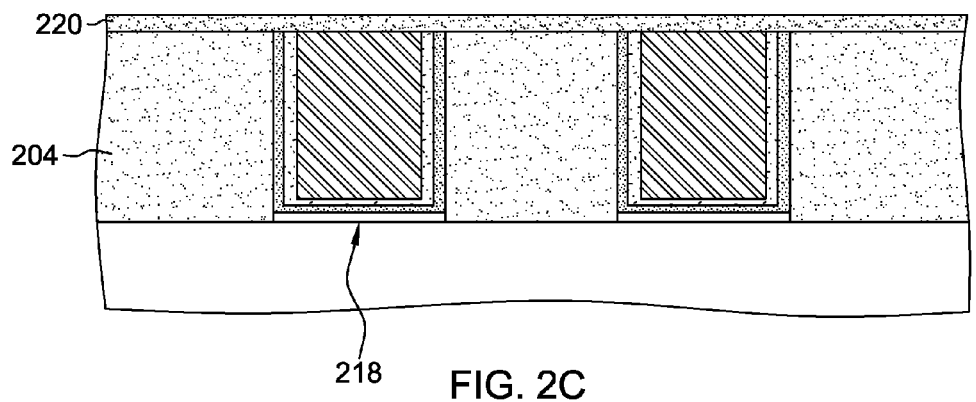
FIG. 2C depicts the semiconductor structure of FIG. 2B with a bridging film provided over the layer of dielectric material and the gate structures, in accordance with one or more aspects of the present invention.

As illustrated in FIG. 2C, a bridging film 220 is provided over dielectric material layer 204, including over gate structure(s) 218, in accordance with one or more aspects of the present invention. By way of example, bridging film 220 may be conformally deposited using a variety of techniques such as, for example, chemical vapor deposition (CVD), atomic vapor deposition (ALD) processes or plasma-enhanced versions of such processes. In one example, the bridging film may be or include an oxide material, which is rich in silicon content. For instance, bridging film 220 may include plasma-enhanced silicon oxide ($SiO_2$), having a thickness in the range of about 1 to 20 nanometers, deposited using a plasma-enhanced chemical vapor deposition (PECVD) process. As a specific example, the thickness of the bridging film may be about 5 nanometers. Additionally, although bridging film may have an intrinsic stress in the range of about −0.1 to 0.1 GPa, in one example, the stress of the bridging film may be neutral stress or substantially zero, for instance, about 0.01 GPa.

In one embodiment, bridging film 220 is formed in a plasma chamber with employing a process gaseous mixture including, for instance, a silane precursor and at least one gaseous material, in the presence of one or more inert gases, such as, helium (He), argon (Ar) and/or nitrogen ($N_2$). By way of example, the bridging film may be deposited using a silane precursor, such as a silane ($SiH_4$) gas and a nitrous oxide ($N_2O$) gas in a plasma chamber, during which silane ($SiH_4$) molecules and nitrous oxide ($N_2O$) molecules may be energized into a plasma to form silicon (Si) ions and oxygen ($O_2$) ions. These silicon (Si) ions and oxygen ($O_2$) ions may combine to form a layer of plasma-enhanced silicon oxide ($SiO_2$), which is rich in silicon, over dielectric material layer 204 and gate structure(s) 218. In one example, the plasma-enhanced process may be performed in the presence of silane ($SiH_4$) gas and nitrous oxide gas ($N_2O$), at a temperature of about 50° C. to 450° C., with a plasma RF power of about 50 to 1000 W for a time period of about 1 to 100 sec. Note that, in one embodiment, plasma-enhanced silicon oxide of the bridging film is substantially denser than the underlying dielectric material layer.

Figure 3:
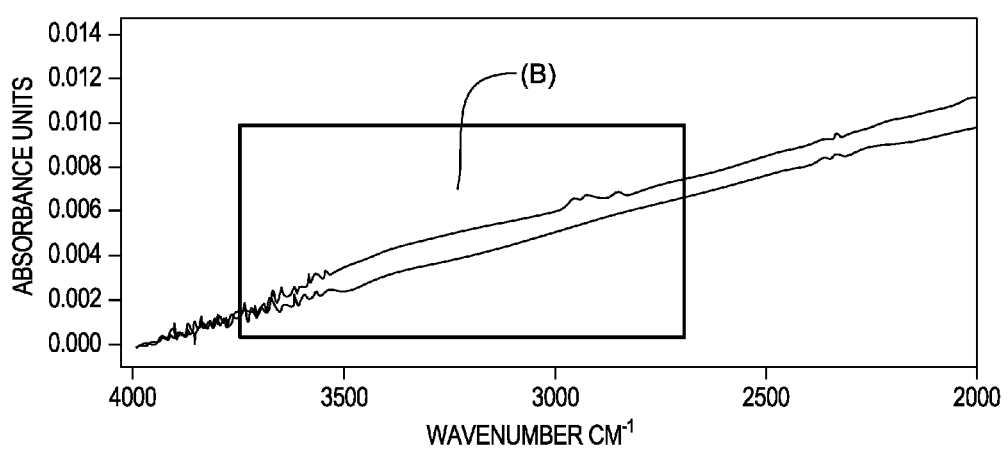
FIG. 3 graphically depicts an absence of hydrogen-bonding groups within the bridging film, in accordance with one or more aspects of the present invention.

As noted above, in one embodiment, hydrogen-bonding groups, for instance, terminal silanol (Si—OH) groups are disposed within dielectric material layer 204. The groups form an inter-molecular hydrogen bonding with electronegative species or "electron-loving" species of adjacent material such as, oxygen atoms within plasma-enhanced silicon oxide material of bridging film 220. Notwithstanding this, a Fourier Transform Infrared (FT-IR) spectrum analysis of bridging film 220 shows an absence of broad silanol (Si—OH) peak (B) at about 3400 cm$^{-1}$ indicating an absence of hydrogen-bonding groups such as silanol (Si—OH) at an upper portion of the bridging film, as shown in FIG. 3. Note that the absence of hydrogen-bonding groups at the upper surface advantageously renders the bridging film chemically inert to chemical bond formations (for instance, hydrogen bonding) with subsequently deposited layers, such as an overlying stress-inducing layer.

Figure 2D:
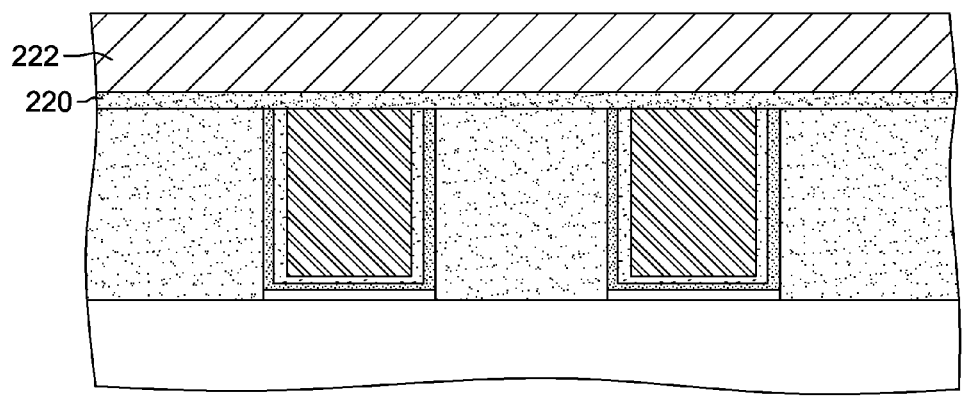
FIG. 2D depicts the structure of FIG. 2C after a stress-inducing layer has been provided over the bridging film, in accordance with one or more aspects of the present invention.

As illustrated in FIG. 2D, a stress-inducing layer 222 may be provided over bridging film 220, in accordance with one or more aspects of the present invention. As used herein, "stress-inducing layer" refers generally to a material film or layer which is designed to induce a stress, such as a compressive stress or a tensile stress, within at least a portion of the underlying layers. Stress-inducing layer 222 may, in one embodiment, form part of the resultant structure, and may be or include a compressive stress-inducing material relative to one or more of the underlying layers or substrate. By way of example, stress-inducing layer 222 may be or include a nitride material, such as, for example, silicon nitride (SiN or $Si_3N_4$) or silicon oxynitride (SiON), which may be deposited using any of a variety of techniques such as, for example, a chemical vapor deposition (CVD), or physical vapor deposition (PVD) process, or plasma-enhanced versions of such processes. Stress-inducing layer 222 may have any suitable thickness. In one example, the thickness of stress-inducing layer 222 may be in the range of about 10 to 200 nanometers. Further, in one example, stress-inducing layer 222 may have an intrinsic compressive stress substantially higher than an intrinsic stress of bridging film 220, for instance, in the range of about 1 to 5 GPa. In a specific example, stress-inducing layer 222 may have an intrinsic compressive stress of, for instance, about 3.3 GPa.

By way of further example, stress-inducing layer 222 may be formed in a plasma chamber using a process gaseous mixture including, for instance, a silane precursor and at least one gaseous material, in presence of one or more inert gases, such as, helium (He), argon (Ar) and/or nitrogen ($N_2$). For instance, stress-inducing layer 222 may be deposited using a silane precursor, such as a silane ($SiH_4$) gas, and an ammonia ($NH_3$) gas in a plasma chamber, during which silane ($SiH_4$) molecules and ammonia ($NH_3$) molecules may be energized into plasma to form silicon (Si) ions and nitrogen ($N_2$) ions. These silicon (Si) ions and nitrogen ($N_2$) ions may combine to form a layer of silicon nitride (SiN) over bridging film 220. In one example, a plasma-enhanced process may be performed, in presence of silane ($SiH_4$) gas and ammonia gas ($NH_3$), at a temperature of about 50° C. to 450° C., with a plasma RF power of about 50 to 1000 W for a time period of about 1 to 100 sec.

As discussed above, the absence of hydrogen-bonding groups at the upper or exposed surface of bridging film 220 facilitates stress-inducing layer 222 adhering to the underlying bridging film 220 without forming a chemical bond between the stress-inducing layer and the bridging film. Note that, in one embodiment, bridging film 220 and stress-inducing layer 222 may advantageously be formed or provided in a common plasma chamber by sequentially injecting the process gases, such as silane gas and nitrous oxide gas, to form the bridging film over the dielectric material and then introducing the process gases, such as silane gas and ammonia gas, to form the stress-inducing layer over the bridging film.

Figure 2E:
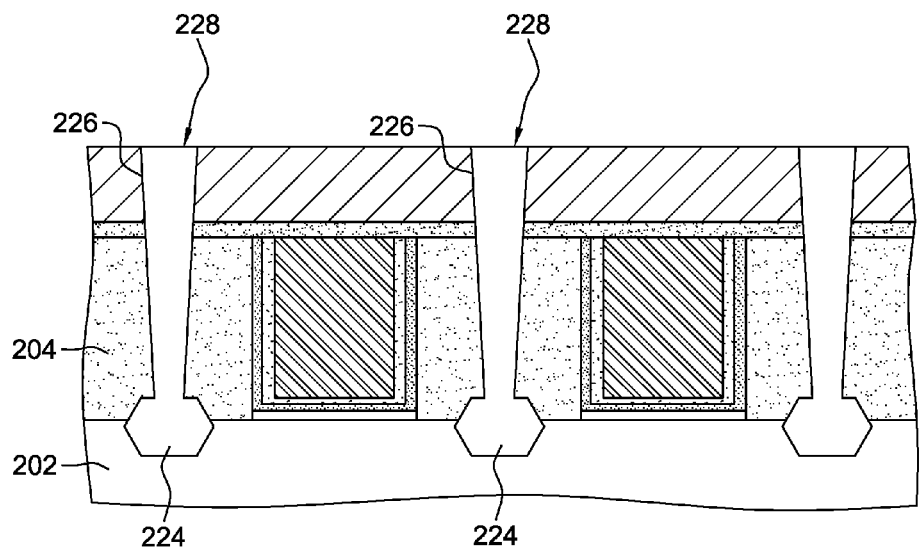
FIG. 2E depicts the structure of FIG. 2D after contact structures have been provided, in accordance with one or more aspects of the present invention.

As depicted in FIG. 2E, subsequent fabrication processing may include forming source and drain regions (also referred to as active regions 224) disposed, for instance, at least partially within substrate 202. The active regions 224 may be formed using any suitable techniques including, for example, ion implantation, epitaxial growth of embedded source/drain materials and activation anneals, etc. Dielectric material layer 204 may be patterned to facilitate creating contact openings 226 within which, a silicide may be formed from a refractory metal, such as, for example, cobalt, nickel, titanium, tantalum, platinum, palladium, rhodium and mixtures thereof that have been chemically reacted with the silicon of active regions 224 exposed within contact openings 226. A conductive contact material may subsequently be provided within contact openings 226, to define conductive contact structures 228. In one example, conductive contact material may be any of a variety of conductive materials, such as, tungsten, copper, aluminum, etc.

Figure 4:
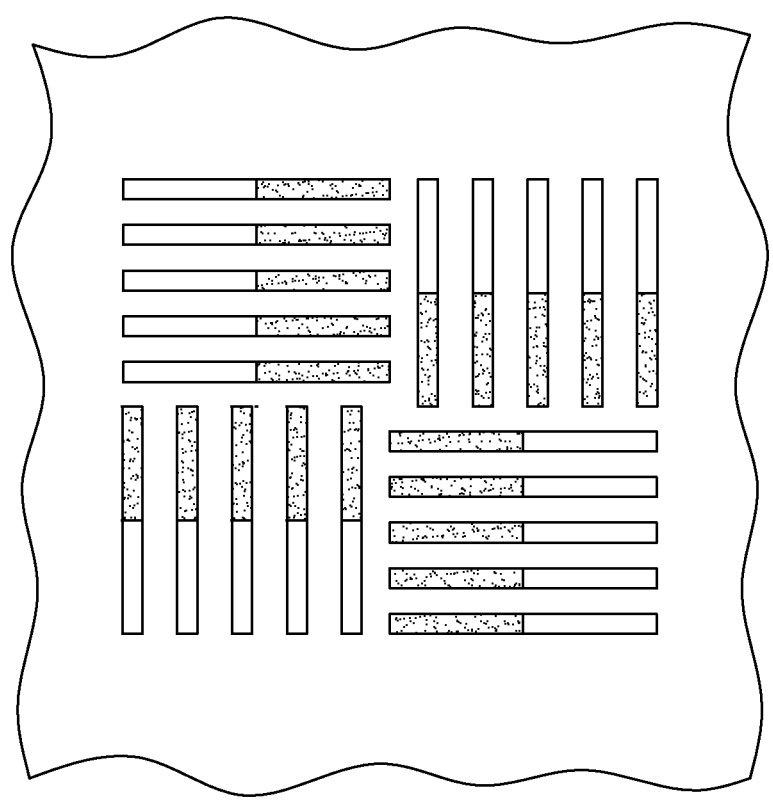
FIG. 4 depicts a partial plan-view of one embodiment of the structure of FIG. 2E and illustrates an absence of delamination induced defects within an exposed surface of the structure having an overlay or alignment mask or pattern thereon, in accordance with one or more aspects of the present invention.

Advantageously, the bridging film disclosed herein facilitates adherence of stress-inducing layer 222 (see FIG. 2D) to the bridging film, without forming a chemical bond, for instance, a silanol (Si—OH) bond, while allowing the bridging film to form a chemical bond with dielectric material layer 204 (see FIG. 2D). This chemical bond selectivity of the bridging film advantageously reduces or minimizes the subsequent occurrence of the one or more voids at the junction or interface of the stress-inducing layers and bridging film, as well as at the interface of the bridging film and the dielectric material layer, and thereby, advantageously reduces subsequent "overlay" mask alignment errors by providing defect free alignment masks or patterns above the layers discussed herein, as shown in FIG. 4.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
fabricating a semiconductor structure, the fabricating comprising:
providing a layer of dielectric material, with at least one gate structure disposed therein, over a semiconductor substrate;
providing a bridging film over the layer of dielectric material with the at least one gate structure disposed therein; and
providing a stress-inducing layer over the bridging film, wherein the bridging film is selected to facilitate adherence to both the underlying layer of dielectric material and the overlying stress-inducing layer by, in part, forming a chemical bond with the layer of dielectric material, without forming a chemical bond with the stress-inducing layer.

2. The method of claim 1, wherein the layer of dielectric material comprises an uncured dielectric material which includes hydrogen-bonding groups disposed therein, and providing the bridging film comprises selecting the bridging film to facilitate hydrogen bonding of the bridging film to the uncured dielectric material.

3. The method of claim 2, wherein the bridging film lacks hydrogen-bonding groups at an upper surface thereof, which facilitates the bridging film being chemically inert to the stress-inducing layer.

4. The method of claim 2, wherein providing the stress-inducing layer comprises selecting the stress-inducing layer to facilitate adherence to the bridging film, without hydrogen bonding between the stress-inducing layer and the bridging film.

5. The method of claim 4, wherein the stress-inducing layer comprises a nitride material and wherein the bridging film comprises a silicon-rich oxide material.

6. The method of claim 1, wherein the layer of dielectric material comprises an uncured dielectric material which includes a first oxide material, and the bridging film comprises a second oxide material, the first oxide material and the second oxide material being different oxide materials, and the second oxide material being denser than the first oxide material.

7. The method of claim 6, wherein the uncured dielectric material is a flowable oxide material, and the bridging film comprises a silicon-rich oxide material.

8. The method of claim 1, wherein providing of the bridging film and providing of the stress-inducing layer occur within a common plasma chamber.

9. The method of claim 8, wherein providing of the bridging film comprises employing a gaseous mixture within the common plasma chamber, the gaseous mixture comprising a silane precursor and at least one gaseous material.

10. The method of claim 9, wherein the at least one gaseous material comprises a nitrous oxide gaseous material.

11. The method of claim 8, wherein providing the stress-inducing layer comprises employing a gaseous mixture within the common plasma chamber, the gaseous mixture comprising a silane precursor and at least one gaseous material.

12. The method of claim 11, wherein the at least one gaseous material comprises an ammonia gaseous material.

13. The method of claim 1, wherein the stress-inducing layer is a compressive stress-inducing layer.

14. A structure comprising:
a semiconductor structure, the semiconductor structure comprising:
   a layer of dielectric material, with at least one gate structure disposed therein, over a semiconductor substrate;
   a bridging film over the layer of dielectric material, with the at least one gate structure disposed therein, the bridging film being chemically bonded to the layer of dielectric material; and
   a stress-inducing layer over the bridging film, and adhered thereto absent chemical bonding thereof to the bridging film.

15. The structure of claim 14, wherein the bridging film layer is hydrogen bonded to the layer of dielectric material.

16. The structure of claim 15, wherein the bridging film lacks hydrogen-bonding groups at an upper surface thereof, which facilitates the bridging film being chemically inert to the stress-inducing layer.

17. The structure of claim 15, wherein the stress-inducing layer comprises a nitride material.

18. The structure of claim 14, wherein the layer of dielectric material comprises a first oxide material, and the bridging film comprises a second oxide material, the first oxide material and the second oxide material being different oxide materials, and the second oxide material being denser than the first oxide material.

19. The structure of claim 18, wherein the bridging film comprises a silicon-rich oxide material.

20. The structure of claim 14, wherein the stress-inducing layer comprises a compressive stress-inducing layer, which induces a compressive stress within at least a portion of the semiconductor substrate.

* * * * *